(12) United States Patent
Kanamori

(10) Patent No.: US 8,716,866 B2
(45) Date of Patent: May 6, 2014

(54) SEMICONDUCTOR DEVICE

(75) Inventor: Kohji Kanamori, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 709 days.

(21) Appl. No.: 12/320,829

(22) Filed: Feb. 5, 2009

(65) Prior Publication Data

US 2009/0212440 A1 Aug. 27, 2009

(30) Foreign Application Priority Data

Feb. 27, 2008 (JP) .................................. 2008-45979

(51) Int. Cl.
*H01L 23/48* (2006.01)
(52) U.S. Cl.
USPC ........................................................ 257/773
(58) Field of Classification Search
USPC .............. 257/E23.039, 773, E21.505, E23.01
See application file for complete search history.

(56) References Cited

U.S. PATENT DOCUMENTS

| 5,898,223 | A  | * | 4/1999  | Frye et al. ...................... 257/777 |
| 6,963,136 | B2 | * | 11/2005 | Shinozaki et al. ............ 257/759 |
| 2003/0054590 | A1 | * | 3/2003 | Murayama et al. ........... 438/109 |
| 2007/0013079 | A1 |   | 1/2007  | Hsu |

FOREIGN PATENT DOCUMENTS

| JP | 61-195056 | 12/1986 |
| JP | 2002-270653 | 9/2002 |
| JP | 2003-224225 A | 8/2003 |

OTHER PUBLICATIONS

Notification of First Office Action dated Nov. 1, 2011 (with an English translation).
Chinese Office Action dated Aug. 30, 2012 with English translation thereof.
Notification of Reasons for Refusal dated Sep. 13, 2011 (with an English translation).

* cited by examiner

*Primary Examiner* — Marcos D. Pizarro
*Assistant Examiner* — Sue Tang
(74) *Attorney, Agent, or Firm* — McGinn IP Law Group, PLLC

(57) ABSTRACT

An object of the present invention is to solve the problem that the number of pads increases due to high packaging density and the size of semiconductor devices increases due to increase of the pad density. A semiconductor device according to the present invention uses a conductor trace on an interconnection substrate to interconnect two nonadjacent pads.

19 Claims, 7 Drawing Sheets

SEMICONDUCTOR DEVICE

BACKGROUND OF THE INVENTION

1. Field of the Invention

The present invention relates to a semiconductor device including an interconnection substrate on which a semiconductor chip is mounted and, in particular, to a technique effectively applicable to a semiconductor device including a center-pad-type semiconductor chip.

2. Description of the Related Art

Apparatuses containing semiconductor devices have become increasingly multifunctional and powerful. With the expansion of functionality of the apparatuses containing semiconductor devices has come a demand for higher-density semiconductor chips. The improvement of performance of the apparatuses containing semiconductor devices requires increase of the speed of semiconductor chips.

Increase of the packaging density of semiconductor chips leads to increase in the number of package pins. In addition, it is essential for techniques for increasing the speed of semiconductor chips to stabilize power supply to the semiconductor chips.

In general, a well-known technique for stably supplying power to semiconductor chips is to divide power supply. That is, multiple power-supply pads are provided and power is supplied through each of the pads.

In other words, increase of both packaging density and performance of semiconductor chips leads to a high pin count.

There is a demand for a high-density packaging technique that enables mounting of high-pin-count semiconductor chips.

Japanese Patent Application Laid-Open No. 2002-270653 discloses a technique for increasing the density of interconnections on an interconnection substrate (interposer) on which a semiconductor chip is to be mounted.

However, the existing technique described above increases the size of an interconnection substrate and semiconductor device when the number or density of pads is further increased.

SUMMARY OF THE INVENTION

A semiconductor device according to the present invention is provided in which two nonadjacent pads are interconnected through a single external terminal using an interconnection substrate.

Preferably, a semiconductor chip is of a center-pad type and a trace on the interconnection substrate connected to the semiconductor chip runs from the interconnection substrate, passes over a pad of the semiconductor chip, and is connected to another pad.

According to the present invention, since pads of a semiconductor chip are interconnected by using a trace on the interconnection substrate as described above, the number of external connection terminals can be minimized.

Furthermore, since the technique according to the present invention does not affect the arrangement of external connection terminals, the flexibility of designs such as the arrangement of external connection terminals is improved as compared with existing techniques.

In addition, the technique enables pads to be interconnected with a low resistance as compared with techniques that use internal conductors of a chip.

In order to make more apparent these and other objects, features, and advantages of the present invention, embodiments of the present invention will be described below in detail with reference to the accompanying drawings.

DETAILED DESCRIPTION OF THE PREFERRED EMBODIMENTS

FIGS. 1 to 8 show a semiconductor device according to a first embodiment of the present invention.

Figure 1:
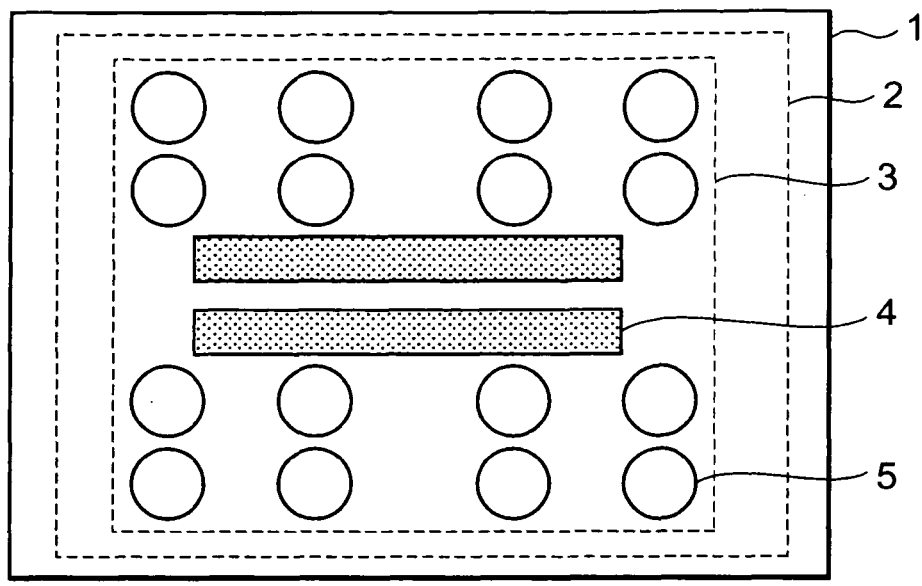
FIG. 1 is a plan view of a semiconductor device according to a first embodiment of the present invention, viewed from the connection terminal side.
Figure 2:
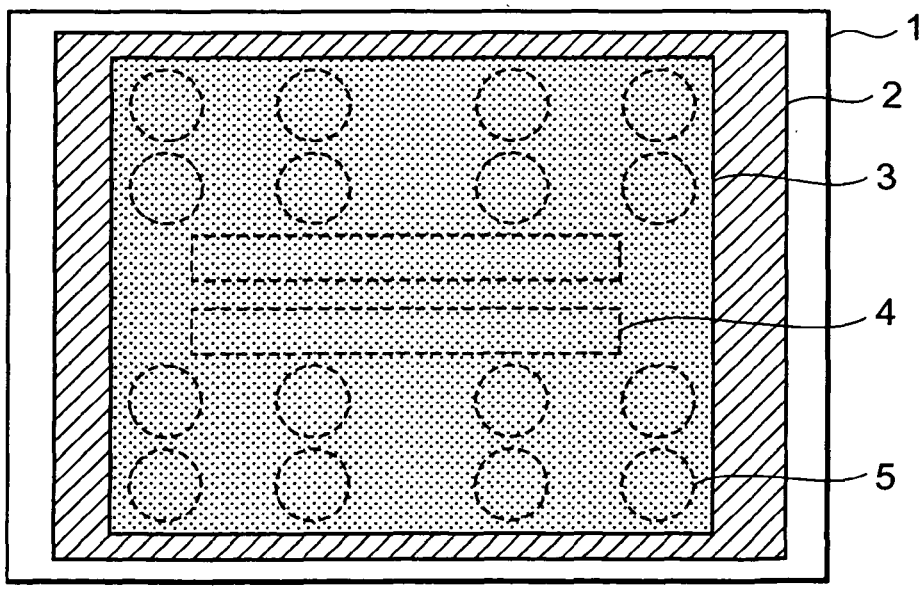
FIG. 2 is a plan view of the semiconductor device according to the first embodiment of the present invention, viewed from the chip side.

FIG. 1 is a plan view showing the back side of the semiconductor device on which external connection terminals (solder balls) 5 are provided and FIG. 2 is a plan view showing the surface of the semiconductor device viewed on which a semiconductor chip 3 is mounted.

The back side will be described first. External connection terminals 5 are provided on a substrate 1. An elastic element 2 is provided between the semiconductor chip 3 and the substrate 1. Also provided on the substrate 1 are openings 4. The openings 4 are also provided in the elastic element 2.

Figure 3:
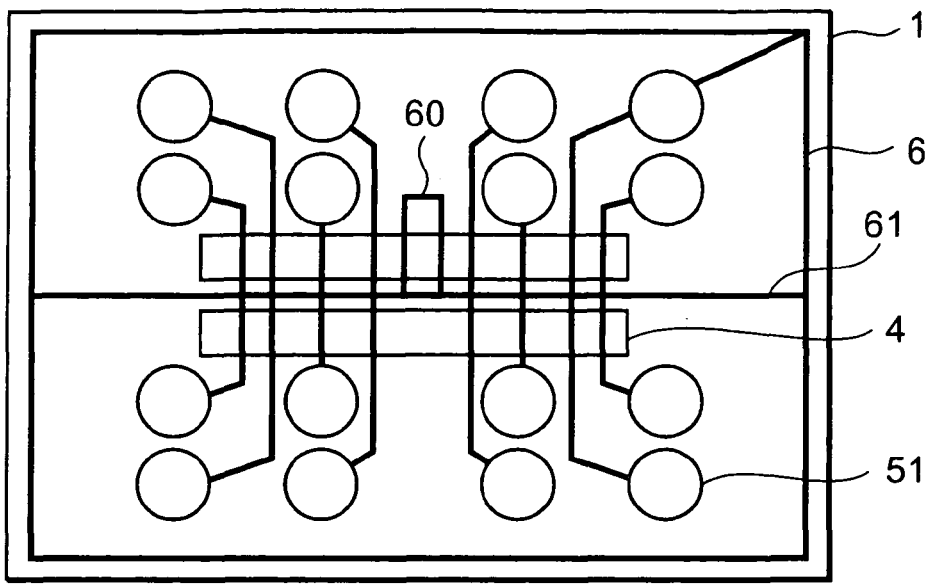
FIG. 3 shows an interconnection pattern according to the first embodiment of the present invention before the chip is mounted.

FIG. 3 shows the substrate and an interconnection pattern 6 on the substrate before the semiconductor chip is mounted. The interconnection pattern includes a main line 6 adjacent to the openings 4 and branch lines running across the openings 4. Some of the branch lines have lands 51 at the end that is not connected to the main line, for connection connected with the external connection terminals. Branch lines in the center of the chip do not have lands and are connected with each other.

Figure 4:
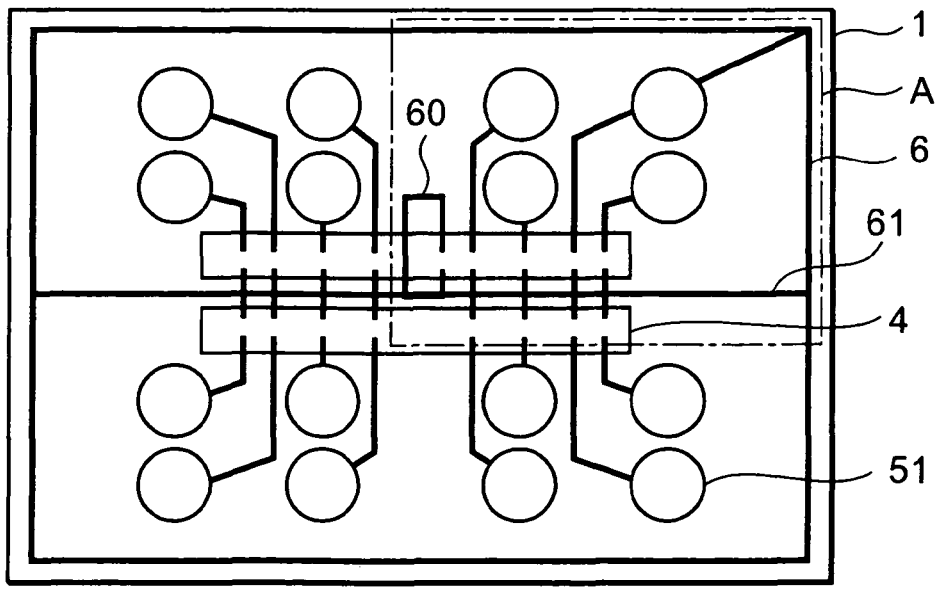
FIG. 4 shows the interconnection pattern according to the first embodiment of the present invention after the chip is mounted.

FIG. 4 shows the substrate after the semiconductor chip, not shown, is mounted on it. Most of the branch lines are disconnected from the main line in the openings 4. The embodiment will be described with reference to FIG. 5, which shows details of region A enclosed in the dashed-line box in FIG. 4.

The trace in the center among the traces 6 on the substrate (not sown) is the main line 61. Lines that branch from the main line, run across the openings 4, and connect to lands 51 are branch lines 62, 63.

The branch lines connect to pads 71, 72, and 73 of the semiconductor chip in the opening 4. To connect the branch lines to the pads, the branch lines are disconnected from the main line in the opening of the semiconductor substrate by disconnecting traces with a bonding tool (not shown). Accordingly, the main line and the pads cannot be interconnected from the main line side in the present embodiment.

Figure 5:
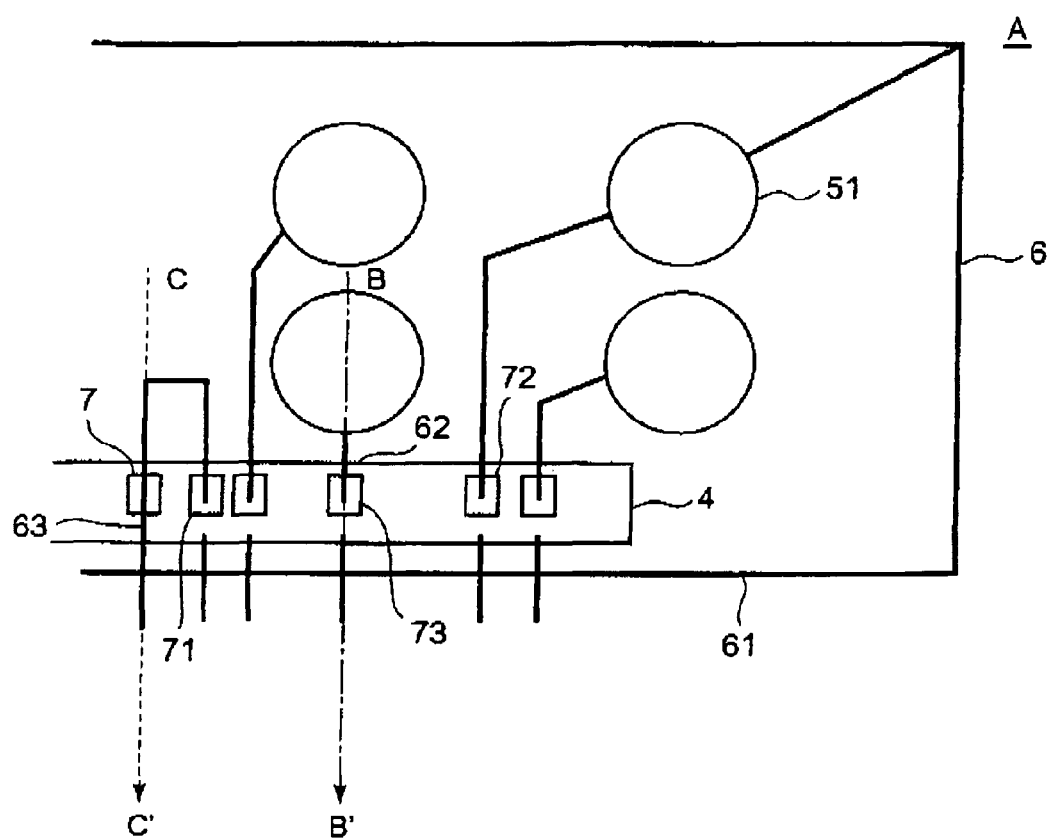
FIG. 5 shows a portion of the interconnection pattern of the first embodiment of the present invention.

In particular, the branch line connecting to pad 71 is disconnected from the main line and is detoured on the other side of the main line as shown in FIG. 5. Then the branch line 63 passes over pad 7 and returns to the main line 61. The branch line 63 then runs through the trace 6 and eventually connects to pad 72 through a land 51 and a branch line. The above-mentioned a branch line is wiring of right and left of a land 51 in FIG. 5.

In this way, pads 71 and 72 which are common electrodes in the chip can be interconnected using the main line, branch lines, and traces on the substrate.

In order to clarify the relation among the branches, main line, and semiconductor chip in FIG. 5, a cross-section structure of the semiconductor device around pads will be described below with respect to cross-sections taken along lines B-B' and C-C' in FIG. 5.

Figure 6:
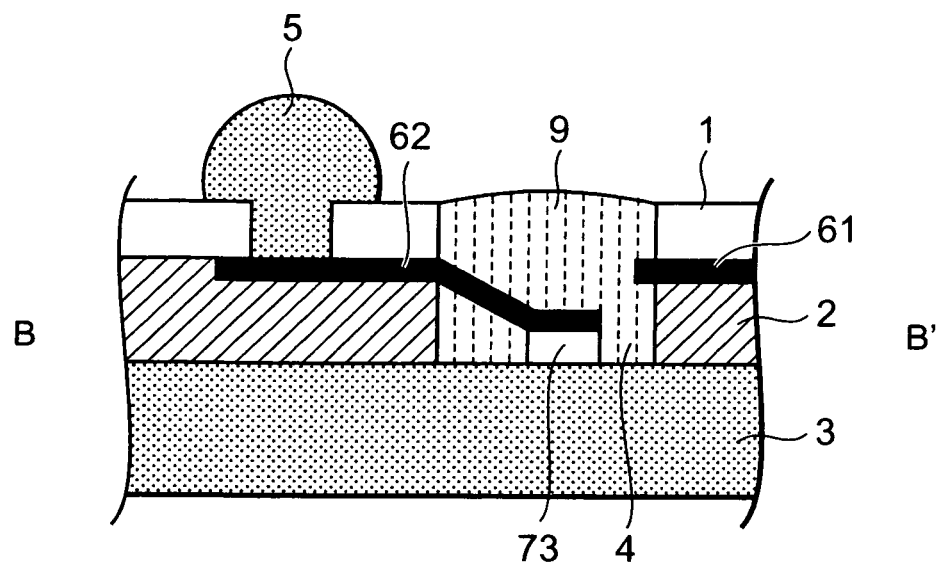
FIG. 6 shows a cross-section of the semiconductor device according to the first embodiment of the present invention.

FIG. 6 shows a cross-section taken along line B-B' in FIG. 5, that is, a cross-section of a portion in which a pad and a branch line are interconnected. The semiconductor chip 3 is shown at the bottom of FIG. 5. The chip 3 has a pad 73. The semiconductor chip 3 is mounted on the substrate 1 and on the main line 61 and a trace 62 patterned on the surface of the substrate 1, with an elastic element 2 between them.

The trace 62, which was connected to the main line 61, is disconnected from the main line 61 in the opening 4 near the main line 61 in order to connect the trace 62 to pad 73.

The opening in which pad and the trace are interconnected is filled with a sealing insulating material 9 such as a liquid resin.

Figure 7:
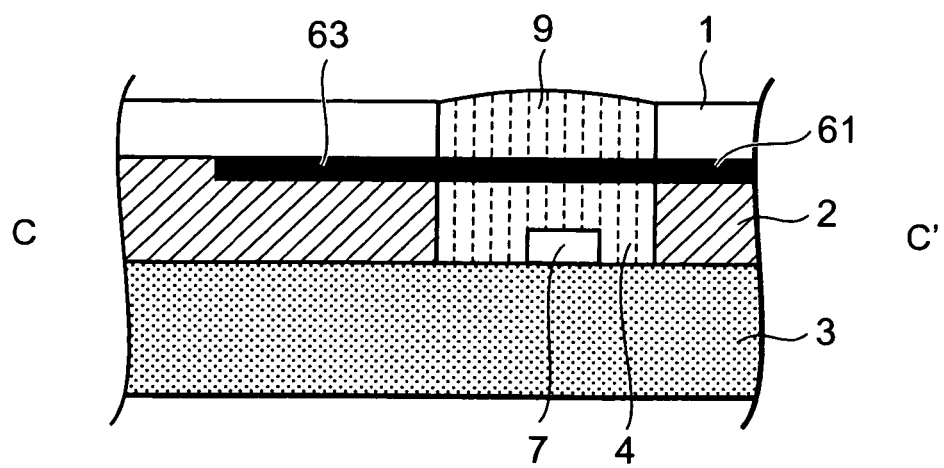
FIG. 7 shows a cross-section of the semiconductor device according to the first embodiment of the present invention.

FIG. 7 shows a cross section taken along line C-C' in FIG. 5, that is, a cross section of a portion in which a branch line passes over a pad. The structure is basically the same as that in FIG. 6 and therefore detailed description of the structure will be omitted. A trace 63 over the pad 7 is not disconnected but directly connects to the main line 61.

Figure 8:
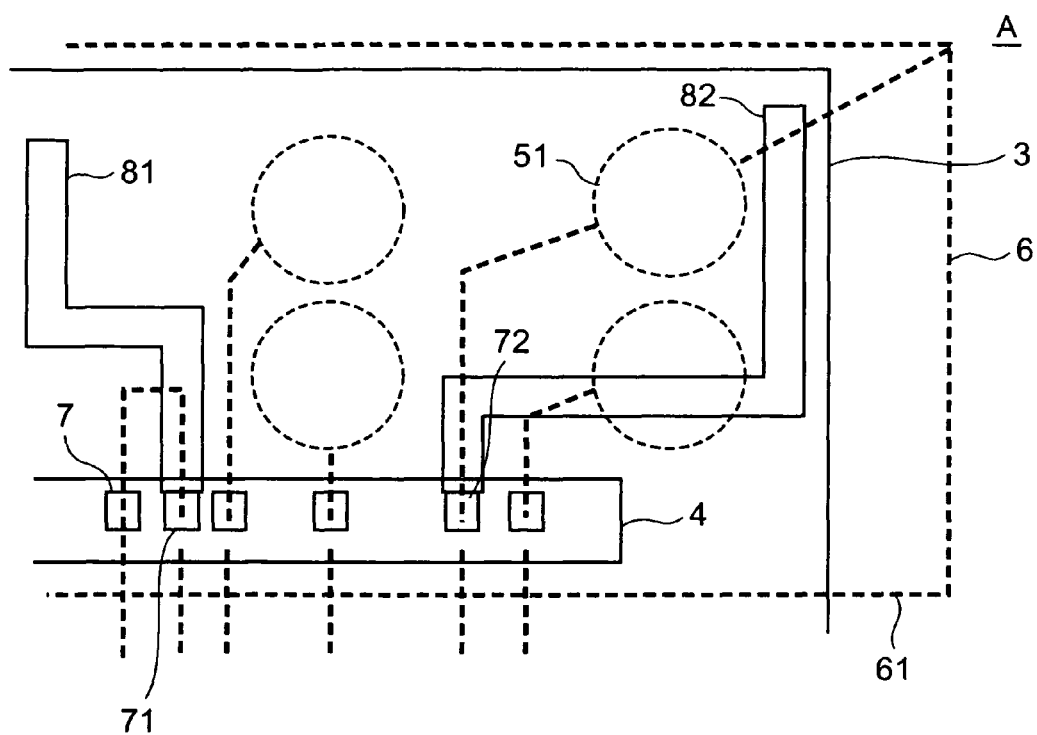
FIG. 8 shows a portion of the interconnection pattern of the chip according to the first embodiment of the present invention.

FIG. 8 shows region A described above in the present embodiment viewed from the semiconductor chip 3 side. Dashed lines and circles in FIG. 8 represent the trace on the substrate.

Pads 71 and 72 have conductors 81 and 82, respectively, inside the chip. The conductors 81 and 82 specifically shown are internal power-supply lines, which are not limitative but illustrative. They may be other lines such as common signal lines.

The conductors 81 and 82 provide an electric potential to predetermined circuit blocks. In order to stabilize the power supply, the conductors 81 and 82 need to be interconnected. Therefore, pads 71 and 72 are interconnected through the main line 61 without using an internal conductor as described above.

This can reduce the interconnection area on the chip. The width and thicknesses of conductors provided inside a chip are limited. Especially when in the future the packaging density and chip size further increase, the increased packaging density and chip site will inevitably add large resistance to the chip. However, the resistance can be kept down by using conductor traces on the substrate.

Figure 9:
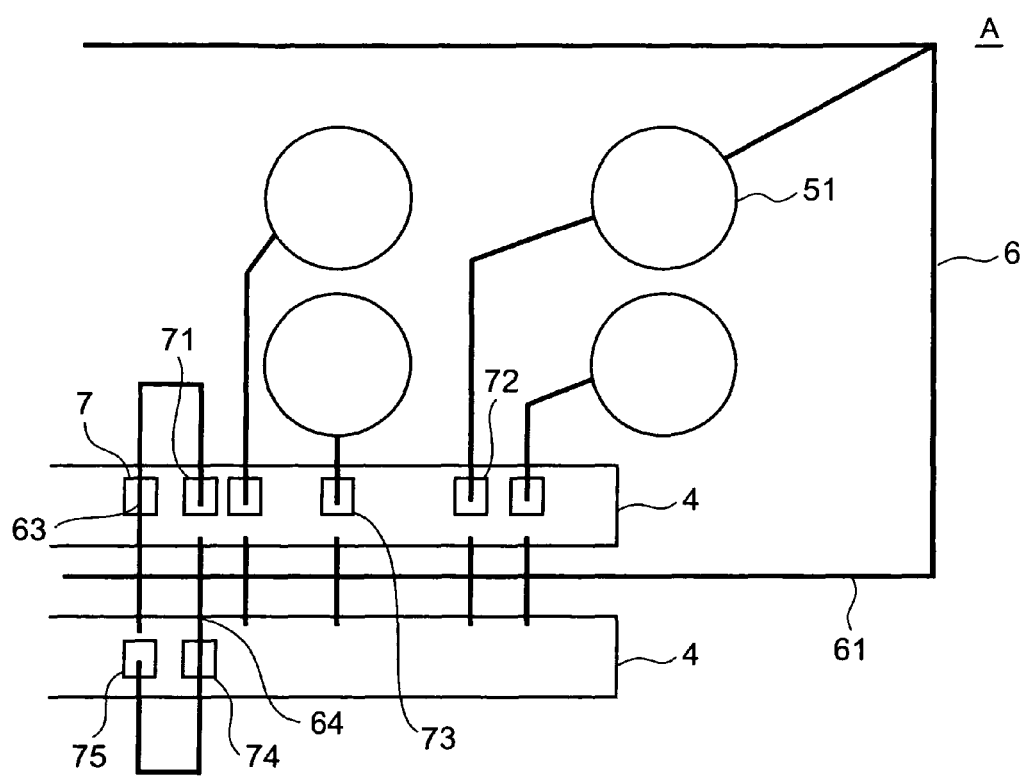
FIG. 9 shows a portion of an interconnection pattern according to a second embodiment of the present invention.

A second embodiment of the present invention will now be described with reference to FIGS. 9 and 10. The first embodiment has been described with respect to pads and traces located on one side of the opening 4. The second embodiment will be described with respect to an example in which pads and traces are provided on both sides of openings 4.

The process from the start to the step of interconnecting pads 71 and 72 through a trace on the substrate is the same as that of the first embodiment. Then, the main line 61 is further connected to a pad 75 provided in a second opening through a branch line 64 that passes over another pad 74.

That is, pads of a semiconductor chip that are separated with the main line 61 between them are interconnected by means of a trace on the substrate including the main line. Here, pads and traces on the second opening side, that is, pads and traces shown below the main line 61 in FIG. 9 that are not necessary for describing the second embodiment are omitted from FIG. 9.

Figure 10:
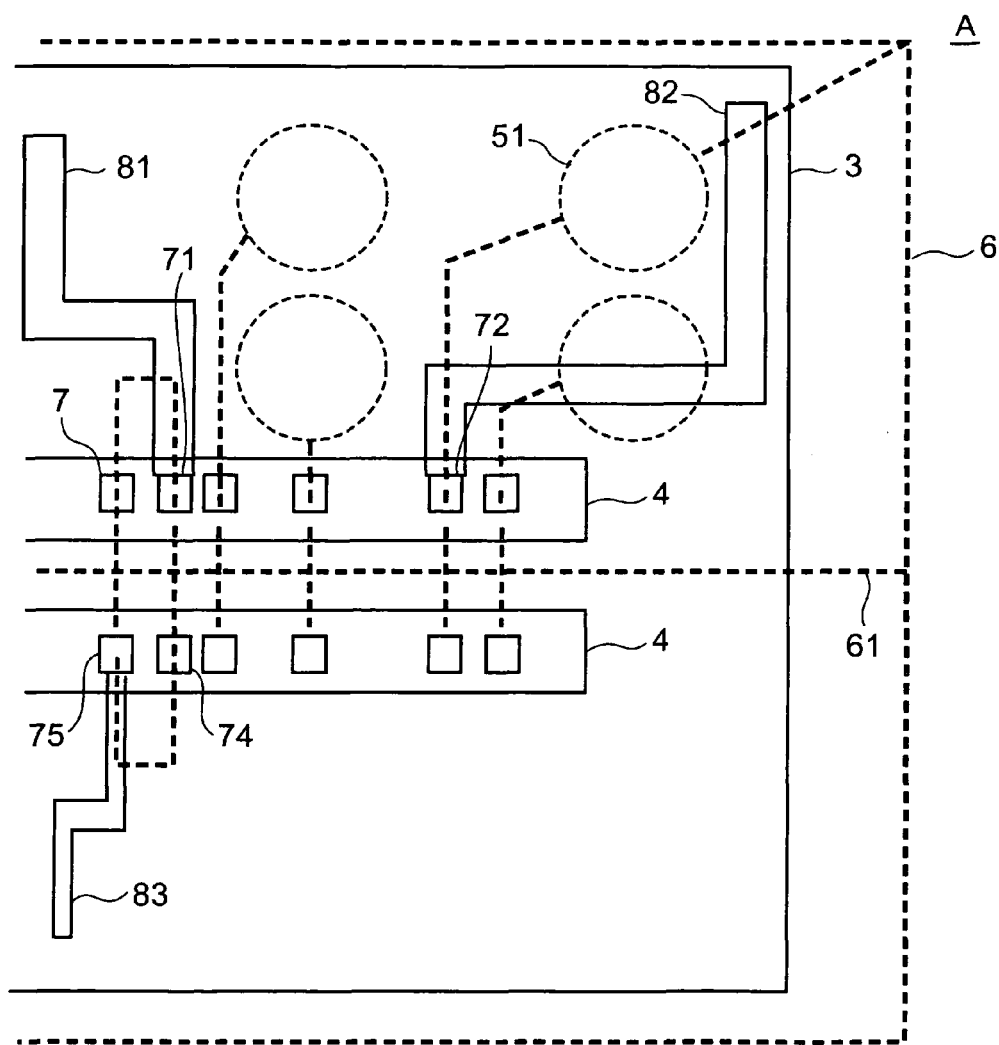
FIG. 10 shows a portion of the interconnection pattern of the chip according to the second embodiment of the present invention.

Thus, pads 71, 72, 75 on both sides of the main line in FIG. 10 and their internal conductors 81, 82, 83 inside the chip can be interconnected by means of traces on the substrate in a space-saving manner with low resistance.

It will be apparent that the present invention is not limited to the embodiments described above and various changes and modifications can be made to the embodiments as appropriate without departing from the technical concept of the present invention. For example, while a center-pad type semiconductor chip has been given above by way example, pads may be arranged along two or four sides.

While BGA (Ball Grid Array) type external connection terminals have been shown herein, the present invention is applicable to LGA (Land Grid Array) type and normal lead-frame type semiconductor devices as well.

Furthermore, any method for connecting nonadjacent pads to traces on the substrate may be used, provided that the nonadjacent pads are interconnected by using traces on the substrate rather than internal conductors in the chip.

What is claimed is:

1. A semiconductor device, comprising:
    a single semiconductor chip including a plurality of pads thereon;
    a plurality of external connection terminals including at least a first external connection terminal; and
    an interconnection substrate including an interconnection pattern connecting the plurality of pads to said external connection terminals,
    wherein first and second pads among the plurality of pads are interconnected by the interconnection pattern through said first external connection terminal connected to said first pad, the second pad is not adjacent to the first pad, and
    wherein the interconnection pattern passes over a third pad, which is other than the first pad and the second pad, without connecting to the third pad.

2. The semiconductor device according to claim 1, wherein the plurality of pads is arranged in line in a center of the semiconductor chip in a first direction.

3. The semiconductor device according to claim 2, wherein a main line of the interconnection pattern extends in parallel to the first direction.

4. The semiconductor device according to claim 2, wherein the plurality of pads are arranged in two lines with a main line between the two lines of the pads.

5. The semiconductor device according to claim 4, wherein the first pad is in one of the two lines along the main line and the second pad is in an other of the two lines along the main line.

6. The semiconductor device according to claim 1, wherein a number of the plurality of pads is greater than a number of the external connection terminals.

7. The semiconductor device according to claim 1, wherein the first and second pads are of a same electric potential or signal.

8. The semiconductor device according to claim 1, further comprising:
an elastic element provided between the single semiconductor chip and the interconnection substrate.

9. The semiconductor device according to claim 8, further comprising:
openings provided on the interconnection substrate and the elastic element.

10. The semiconductor device according to claim 9, wherein the interconnection pattern comprises a main line adjacent to the openings and branch lines running across the openings.

11. The semiconductor device according to claim 10, wherein a group of the branch lines comprises lands at an end thereof that is connected to the external connection terminals and is unconnected to the main line.

12. The semiconductor device according to claim 1, wherein the third pad comprises one of the plurality of pads.

13. The semiconductor device according to claim 1, further comprising:
a sealing material that spaces apart the interconnection pattern from the third pad.

14. The semiconductor device according to claim 1, wherein, in a plan view, a branch of the interconnection pattern that connects the second pad to the first pad passes over the third pad.

15. The semiconductor device according to claim 1, wherein, in a plan view, the first pad is located between the second pad and the third pad.

16. A semiconductor device, comprising:
a single semiconductor chip including a first pad, a second pad, and a third pad thereon; and
an interconnection substrate including an interconnection pattern, said interconnection pattern including a main line, a first branch line, a second branch line, and a third branch line,
wherein said first branch line is coupled to said first pad,
wherein said second branch line is coupled between an external connection terminal, and said second pad that is not adjacent to said first pad,
wherein said third branch line is coupled between said first branch line and said main line, and passes over said third pad without connecting to said third pad, and
wherein said main line is coupled to said second branch through said external connection terminal.

17. The semiconductor device according to claim 16, wherein first and second pads are interconnected by the interconnection pattern through said external connection terminal connected to said first pad.

18. The semiconductor device according to claim 16, wherein, in a plan view, a part of the interconnection pattern that connects the second pad to the first pad passes over the third pad.

19. The semiconductor device according to claim 16, wherein, in a plan view, the first pad is located between the second pad and the third pad.

* * * * *